(12) United States Patent
Brown et al.

(10) Patent No.: US 11,444,042 B2
(45) Date of Patent: Sep. 13, 2022

(54) MAGNETIC STRUCTURES IN INTEGRATED CIRCUIT PACKAGES

(71) Applicant: Intel Corporation, Santa Clara, CA (US)

(72) Inventors: Andrew James Brown, Phoenix, AZ (US); Ying Wang, Chandler, AZ (US); Chong Zhang, Chandler, AZ (US); Lauren Ashley Link, Mesa, AZ (US); Yikang Deng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 951 days.

(21) Appl. No.: 16/000,372

(22) Filed: Jun. 5, 2018

(65) Prior Publication Data

US 2019/0371744 A1    Dec. 5, 2019

(51) Int. Cl.
*H01L 23/64* (2006.01)
*H01F 3/14* (2006.01)
*H01F 27/06* (2006.01)
*H01F 41/02* (2006.01)

(52) U.S. Cl.
CPC .............. *H01L 23/645* (2013.01); *H01F 3/14* (2013.01); *H01F 27/06* (2013.01); *H01F 41/02* (2013.01)

(58) Field of Classification Search
CPC ..... H01F 2017/0066; H01F 2017/0086; H01F 2017/002; H01F 2017/2809
See application file for complete search history.

(56) References Cited

U.S. PATENT DOCUMENTS

| | | | |
|---|---|---|---|
| 2002/0090755 A1* | 7/2002 | Matsuzaki | H01F 10/3254 438/108 |
| 2015/0048918 A1 | 2/2015 | Park et al. | |
| 2015/0124418 A1* | 5/2015 | Song | H05K 1/165 361/765 |
| 2020/0075511 A1 | 3/2020 | Brown et al. | |

FOREIGN PATENT DOCUMENTS

| | | | |
|---|---|---|---|
| JP | 2002324962 A | 11/2002 | |
| JP | JB 2002-324962 | * 11/2002 | ............... H05K 1/16 |
| JP | 2016015370 A | 1/2016 | |
| KR | 100842475 B1 | 7/2008 | |

OTHER PUBLICATIONS

PCT International Search Report and Written Opinion issued in PCT/US2019/030837 dated Aug. 22, 2019; 12 pages.

* cited by examiner

*Primary Examiner* — John A Bodnar
(74) *Attorney, Agent, or Firm* — Akona IP PC

(57) ABSTRACT

Disclosed herein are magnetic structures in integrated circuit (IC) package supports, as well as related methods and devices. For example, in some embodiments, an IC package support may include a conductive line and a magnetic structure around a top surface of the conductive line and side surfaces of the conductive line. The magnetic structure may have a tapered shape that narrows toward the conductive line.

18 Claims, 12 Drawing Sheets

MAGNETIC STRUCTURES IN INTEGRATED CIRCUIT PACKAGES

BACKGROUND

The performance of some integrated circuit (IC) elements, such as inductors, may be enhanced by the use of magnetic materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
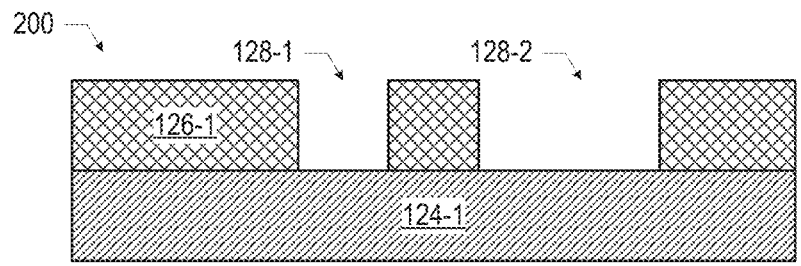
FIGS. 1A-1J illustrate stages in an example process of manufacturing a portion of an integrated circuit (IC) package support having a magnetic structure, in accordance with various embodiments.

Disclosed herein are magnetic structures in integrated circuit (IC) package supports, as well as related methods and devices. For example, in some embodiments, an IC package support (e.g., a package substrate or an interposer) may include a conductive line and a magnetic structure around a top surface of the conductive line and side surfaces of the conductive line. The magnetic structure may have a tapered shape that narrows toward the conductive line.

Magnetic structures may improve the electrical performance of some IC assemblies. For example, using inductors enhanced with magnetic structures (e.g., magnetic-material-enhanced air core inductors (ACIs) in a package substrate or other IC package support may improve power delivery performance. However, conventional techniques for forming such magnetic structures (e.g., conventional paste printing) may have inadequate dimension control (e.g., in both lateral dimensions and thickness) for desired applications; designers must include a large keep-out zone around such structures to mitigate the risk of bridging, increasing the footprint of the structure in both the x-/y- and z-directions. Planarization may be performed to control the thickness of a magnetic structure, but such processes are expensive and not conventionally compatible with high volume manufacturing (HVM). Further, the achievable minimum thickness of conventional magnetic structures may be so high as to necessitate the use of high aspect ratio vias on the same layer. Such vias may be difficult to fabricate (e.g., due to limitations of laser drilling, via cleaning, and metal filling), and may present reliability issues (e.g., due to the increased crack risk arising from vias with small bottom diameters).

Various ones of the embodiments disclosed herein may provide process flows and structures that may address one or more of the issues highlighted above, and may be compatible with HVM processes.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1J, the phrase "FIG. 2" may be used to refer to the collection of drawings of FIGS. 2A-2F, etc.

A number of different magnetic structures are disclosed herein, as are a number of different techniques for forming these magnetic structures, and assemblies and IC package supports in which these magnetic structures may be present. For example, FIGS. 1A-1J illustrate stages in an example process of manufacturing a portion of an IC package support (e.g., a package substrate or an interposer) having a magnetic structure, in accordance with various embodiments. Although the operations of FIG. 1 (and others of the accompanying figures) may be illustrated with reference to particular embodiments of the IC package supports 100 and magnetic structures 110 disclosed herein, the method may be used to form any suitable IC package supports 100 and/or magnetic structures 110. Operations are illustrated once each and in a particular order in FIG. 1 (and others of the accompanying figures), but the operations may be reordered and/or repeated as desired (e.g., with different operations performed in parallel when manufacturing multiple IC package supports 100 and/or magnetic structures 110 simultaneously).

FIG. 1A illustrates an assembly 200 including a carrier 124-1 on which a patterned photoresist 126-1 (e.g., a dry film resist) is present. In some embodiments, the carrier 124-1 may be a conductive core having a surface on which subsequent pleading operations may be performed (e.g., as discussed below with reference to FIG. 1B). For example, the carrier 124-1 may be a copper core. Further, the carrier 124-1 may act as a laser stop (as discussed further below); in some embodiments in which the carrier 124-1 has a copper surface, that copper surface may have a thickness of at least 10 microns (e.g., between 10 microns and 15 microns). More generally, the carrier 124-1 may include any suitable material for performing subsequent manufacturing operations, and providing mechanical stability during subsequent manufacturing operations (e.g., silicon, glass, ceramic, materials having a coefficient of thermal expansion similar to the components that will be positioned on the carrier 124-1, etc.). The photoresist 126-1 may be initially deposited on the carrier 124-1 using any suitable technique (e.g., lamination or spin-on deposition), and the photoresist 126-1 may be patterned using any suitable lithographic technique (e.g., exposing the photoresist 126-1 with a mask to change the solubility of different portions of the photoresist 126-1 and then etching away the more soluble portions, as known in the art). The patterned photoresist 126-1 may include cavities 128, and the surface of the carrier 124-1 may be exposed at the bottom of these cavities 128. Although two cavities 128 are illustrated in FIG. 1A, an assembly like the assembly 200 may include any desired number and shapes of cavities 128 in the patterned photoresist 126-1.

Figure 1B:
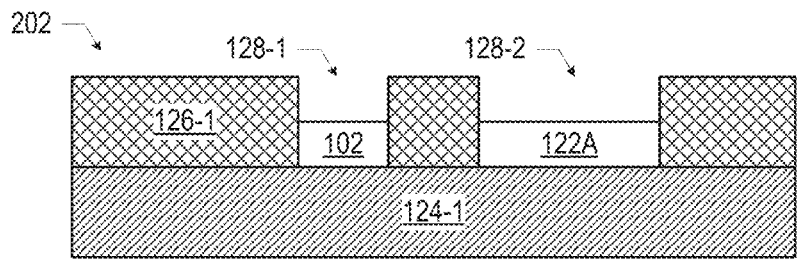

FIG. 1B illustrates an assembly 202 subsequent to forming conductive material in the cavities 128 of the assembly 200 (FIG. 1A) to a desired thickness. In the cavity 128-1, the conductive material may provide a conductive line 102 (e.g., extending in and out of the drawings sheet). In the cavity 128-2, a conductive material may provide a portion 122A of a conductive pad 122, as discussed further below with reference to FIGS. 1C-1D. The thickness of the conductive material in the cavities 128 may be selected to be equal to a desired thickness of conductive lines 102 in the associated metallization layer. For example, in some embodiments, the thickness of the conductive material in the cavities 128 of the assembly 202 (e.g., the thickness of the conductive line 102) may be between 20 microns and 30 microns (e.g., 25 microns). The conductive material of the assembly 202 may be formed using any suitable technique. For example, the conductive material may be electrolytically plated on the surface of the carrier 124-1. The conductive material may have any suitable material composition; for example, the conductive material may be copper.

Figure 1C:
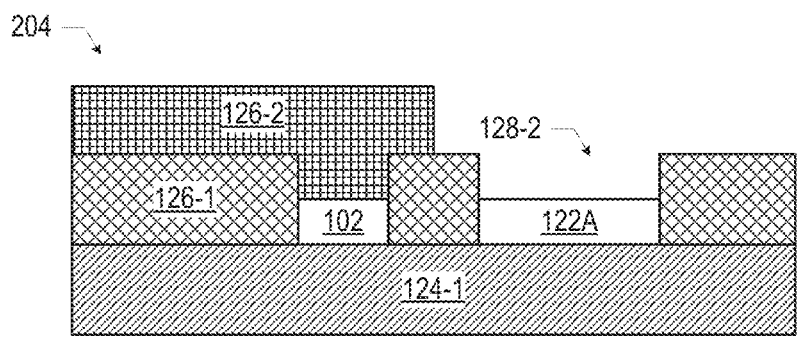

FIG. 1C illustrates an assembly 204 subsequent to forming an additional patterned photoresist 126-2 on the assembly 202 (FIG. 1B). The additional patterned photoresist 126-2 may be formed on the assembly 202 so as to cover the conductive line 102 and fill the remainder of the cavity 128-1, while leaving the portion 122A exposed. The photoresist 126-2 may be deposited and patterned using any suitable technique (e.g., any of the techniques discussed above with reference to the photoresist 126-1).

Figure 1D:
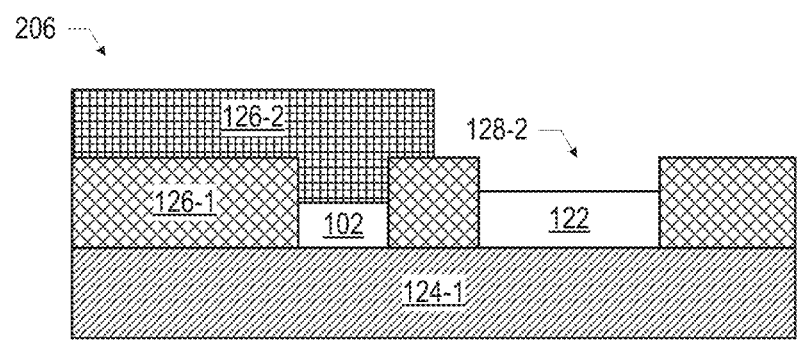

FIG. 1D illustrates an assembly 206 subsequent to forming additional conductive material in the cavity 128-2 of the assembly 202 (FIG. 1C) on top of the portion 122A to a desired thickness to form a conductive pad 122. The total thickness of the conductive pad 122 may be greater than the total thickness of the conductive line 102, as shown, and may be selected to have any suitable value. For example, in some embodiments, the thickness of the conductive pad 122 may be between 20 microns and 50 microns (e.g., 35 microns). The additional conductive material of the assembly 206 may be formed using any suitable technique (e.g., electrolytic plating). Utilizing a thicker conductive pad 122 may reduce the thickness (and aspect ratio) of a conductive via 120 that will extend through the layer of dielectric material 104-1 to make conductive contact with the conductive pad 122 (e.g., as discussed below with reference to FIG. 1I-1J), improving manufacturability and reliability.

Figure 1E:
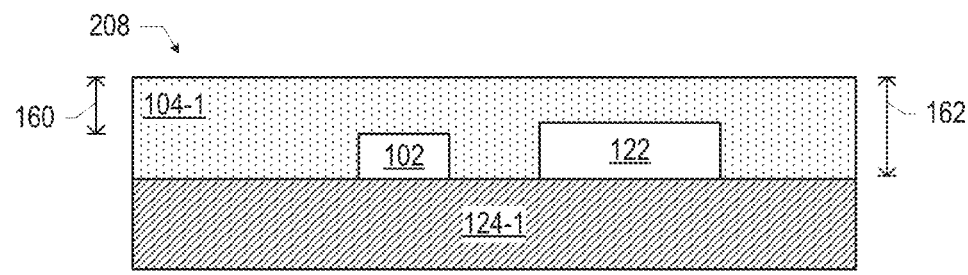

FIG. 1E illustrates an assembly 208 subsequent to stripping the photoresists 126-1 and 126-2 from the assembly 206 (FIG. 1D), and forming a layer of dielectric material 104-1 over the conductive line 102 and the conductive pad 122. The layer of dielectric material 104-1 may be formed using any suitable technique (e.g., lamination). In some embodiments, after the photoresist 126 have been stripped from the assembly 206, a surface roughening operation may be performed to increase the roughness of the exposed top surface of the carrier 124-1 and the exposed surfaces of the conductive line 102 and the conductive pad 122 to improve mechanical adhesion between these elements and the layer of dielectric material 104-1. The thickness 162 of the layer of dielectric material 104-1 may be selected to have any suitable value. For example, in some embodiments, the thickness 162 of the layer of dielectric material 104-1 may be between 55 microns and 75 microns. In some embodiments, the thickness 160 of the layer of dielectric material 104-1 on the top surface of the conductive line 102 may be between 30 microns and 50 microns (e.g., 40 microns). The dielectric materials 104 disclosed herein may include any suitable dielectric materials. For example, a dielectric material 104 may be a buildup film (e.g., an organic, polymer-based dielectric film).

Figure 1F:
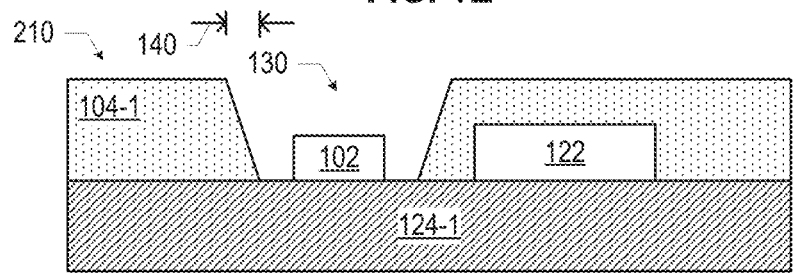

FIG. 1F illustrates an assembly 210 subsequent to forming a cavity 130 in the layer of dielectric material 104-1 of the assembly 208 (FIG. 1E). The cavity 130 may expose the top and side surfaces of the conductive line 102, and a portion of the top surface of the carrier 124-1 may also be exposed at the bottom of the cavity 130. The cavity 130 may be tapered, narrowing from the top surface of the layer of dielectric material 104-1 toward the conductive line 102. In some embodiments, the taper distance 140 may be between 5 microns and 15 microns (e.g., between 5 microns and 10 microns). Any suitable technique may be used to form the cavity 130. For example, the cavity 130 may be formed by laser drilling (e.g., laser skiving), with the top surface of the carrier 124-1 and the conductive line 102 serving as laser stops. In some embodiments, a desmear operation may be performed after forming the cavity 130.

Figure 1G:
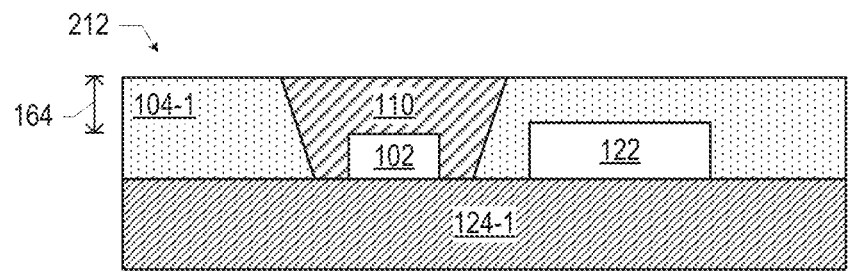

FIG. 1G illustrates an assembly 212 subsequent to forming a magnetic structure 110 in the cavity 130 of the assembly 210 (FIG. 1F) by forming a magnetic material in the cavity 130. The magnetic material may be a magnetic paste (e.g., a resin material having magnetic particles in a polymer matrix, such as iron particles in an epoxy matrix). In some embodiments, forming the magnetic material in the cavity 130 may include dispensing the magnetic material into the cavity 130 using a tool similar to that used for some solder dispensing applications. In some embodiments, forming the magnetic material in the cavity 130 may include stencil printing the magnetic material into the cavity 130 (e.g., as discussed in further detail below with reference to FIG. 7C). After initial deposition, the magnetic paste may be allowed to cure to form the magnetic structure 110. The magnetic structure 110 may have a top surface that is substantially coplanar with the top surface of the layer of dielectric material 104-1. The magnetic structure 110 may be proximate to (e.g., in contact with) the top surface of the conductive line 102, as well as side surfaces of the conductive line 102, as shown. The magnetic structure 110 may be tapered, narrowing from its top surface toward the conductive line 102, in accordance with any of the embodiments discussed above with reference to the cavity 130 in which the magnetic structure 110 is formed. In some embodiments, the thickness 164 of the magnetic structure 110 above the top surface of the conductive line 102 may be between 30 microns and 50 microns (e.g., 40 microns), as discussed above with reference to the thickness 160 of the layer of dielectric material 104-1 above the conductive line 102. Using a cavity 130 to control the shape and dimensions of a magnetic structure 110 may mitigate the risks of magnetic paste bleedout and variable dimensions that are associated with conventional paste printing techniques. Further, in some embodiments, the use of a cavity 130 to form the magnetic structure 110 may not require the use of a mask. Since conventional masks used to print magnetic paste typically leave significant paste residue on the mask after printing, avoiding the use of such masks may reduce manufacturing complexity and improve reliability.

Figure 1H:
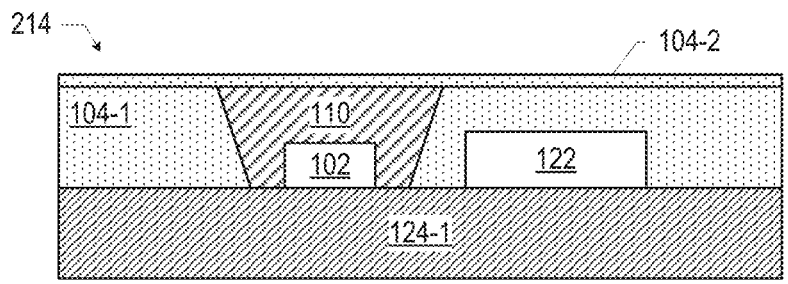

FIG. 1H illustrates an assembly 214 subsequent to forming a layer of dielectric material 104-2 on the top surface of the assembly 212 (FIG. 1G). The layer of dielectric material 104-2 may extend over the layer of dielectric material 104-1 and the magnetic structure 110. The layer of dielectric material 104-2 may have any suitable thickness; for example, in some embodiments, the thickness of the layer of dielectric material 104-2 may be between 5 microns and 10 microns. The layer of dielectric material 104-2 may be deposited using any suitable technique (e.g., lamination). The layer of dielectric material 104-2 may encapsulate the magnetic structure 110, and protect it from subsequent wet chemistry.

Figure 1I:
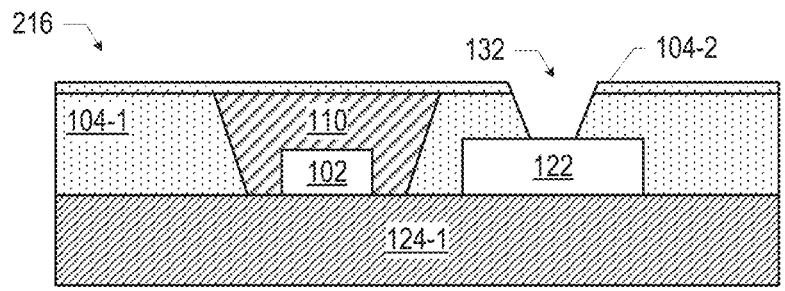

FIG. 1I illustrates an assembly 216 subsequent to forming a cavity 132 through the layer of dielectric material 104-2 and the layer of dielectric material 104-1 to expose a portion of the top surface of the conductive pad 122 of the assembly 214 (FIG. 1H). The cavity 132 may be formed by laser drilling (with the top surface of the conductive pad 122 serving as a laser stop), and may itself be tapered, narrowing from the top surface of the layer of dielectric material 104-2 to the conductive pad 122. In some embodiments in which the layers of dielectric material 104-1 and 104-2 are photo-imageable dielectrics, the cavity 132 may be formed by selectively exposing and developing the layers of dielectric material 104-1 and 104-2, instead of laser drilling, as known in the art.

Figure 1J:
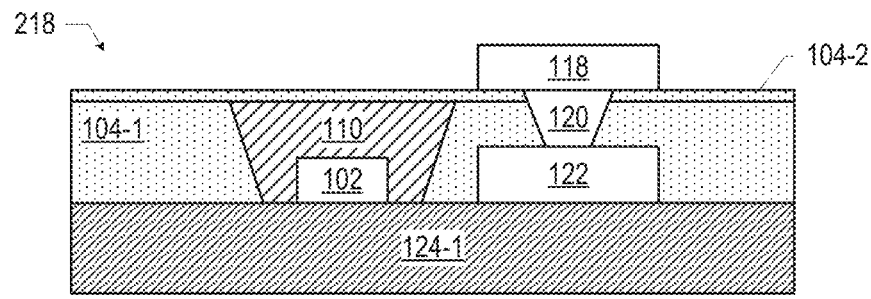

FIG. 1J illustrates an assembly 218 subsequent to forming a conductive via 120 in the cavity 132 of the assembly 216 (FIG. 1I), and also forming a conductive pad 118 on the conductive via 120. The conductive via 120 and the conductive pad 118 may be formed using any suitable techniques. For example, in a semi-additive process, a seed layer may be formed over the assembly 216, a photoresist may be deposited and patterned to expose the seed layer in the cavity 132 and a portion of the area on the top surface of the layer of dielectric material 104-2, conductive material (e.g., copper) may be electroplated on the seed layer, the photoresist may be stripped, and a brief seed etch may be performed, resulting in the conductive via 120 and the conductive pad 118. Conductive lines (not shown) may be formed on the top surface of the layer of dielectric material 104-2 simultaneously with the formation of the conductive pad 118; these conductive lines may have a same thickness as the thickness of the conductive pad 118. In some embodiments, the conductive vias 120 disclosed herein may have bottom (smaller) diameter that are greater than 45 microns.

In the process illustrated in FIG. 1, the layer of dielectric material 104-2 is thin. Forming such thin layers of dielectric material (e.g., by lamination) may, in some manufacturing environments, result in a large undulation of the thin layer of dielectric material and/or an increased risk of voids under the thin layer of dielectric material (e.g., when the magnetic material deposition process has a high variability). FIG. 2 illustrates another example process of manufacturing a portion of an IC package support having a magnetic structure 110 in which a thicker layer of dielectric material 104-2 may be used. The use of a thicker layer of dielectric material 104-2 may reduce the sensitivity of the manufacturing process to underlying dimensional variation while retaining desired feature dimensions, at a cost of higher risk of bleedout of the magnetic paste used to form the magnetic structure 110.

Figure 2A:
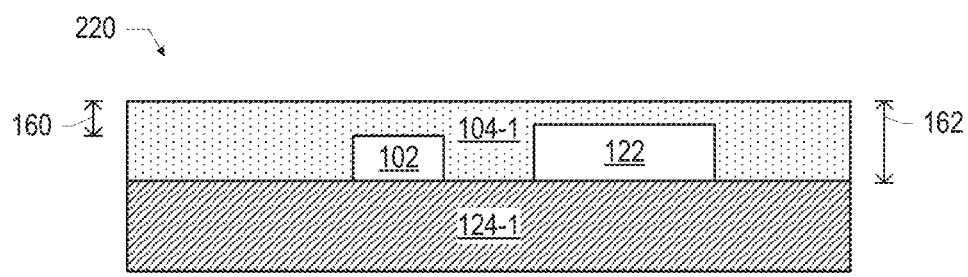
FIGS. 2A-2F illustrate stages in another example process of manufacturing a portion of an IC package support having a magnetic structure, in accordance with various embodiments.

FIG. 2A illustrates an assembly 220 that is substantially similar to the assembly 208 of FIG. 1E, but in which the layer of dielectric material 104-1 is thinner than that illustrated in FIG. 1E. For example, in the assembly 220, the thickness 162 of the layer of dielectric material 104-1 may be between 45 microns and 65 microns, and the thickness 160 of the layer of dielectric material 104-1 above the top surface of the conductive line 102 may be between 20 microns and 40 microns (e.g., 30 microns).

Figure 2B:
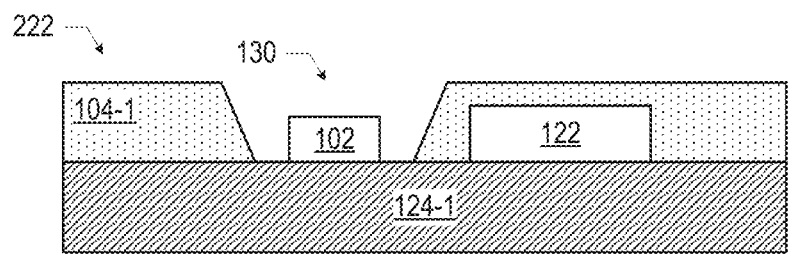

FIG. 2B illustrates an assembly 222 subsequent to forming a cavity 130 in the layer of dielectric material 104-1 of the assembly 220 (FIG. 2A). The cavity 130 of the assembly 222 may take the form of any of the embodiments of the cavity 130 of the assembly 210. In some embodiments, a desmear operation may be performed after forming the cavity 130.

Figure 2C:
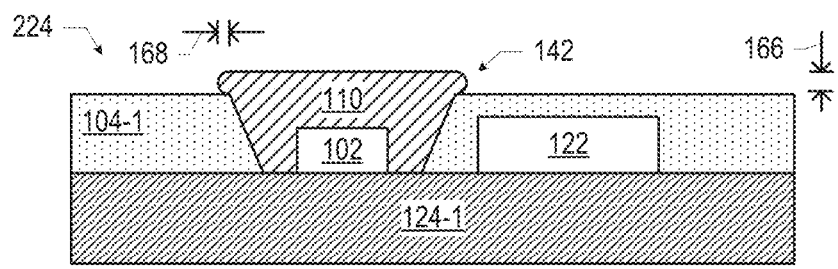

FIG. 2C illustrates an assembly 224 subsequent to forming a magnetic structure 110 in the cavity 130 of the assembly 222 (FIG. 2B). The magnetic structure 110 may be formed by "overfilling" the cavity 130 with a magnetic paste in accordance with any of the embodiments discussed above with reference to FIG. 1G. As shown in FIG. 2C, the magnetic structure 110 may fill the cavity 130, and may extend above the cavity 130. For example, in some embodiments, the magnetic structure 110 may have a rounded portion 142 that extends above the top surface of the layer of conductive material 104-1 by distance 166 between 5 microns and 15 microns (e.g., 10 microns). The rounded portion 142 of the magnetic structure 110 may also extend onto the adjacent top surface of the layer of dielectric material 104-1 by a distance 168 between 0 microns and 20 microns. The magnetic structure 110 of FIG. 2C may thus have a "muffin" shape, with a tapered portion at the bottom and a rounded portion 142 at the top.

Figure 2D:
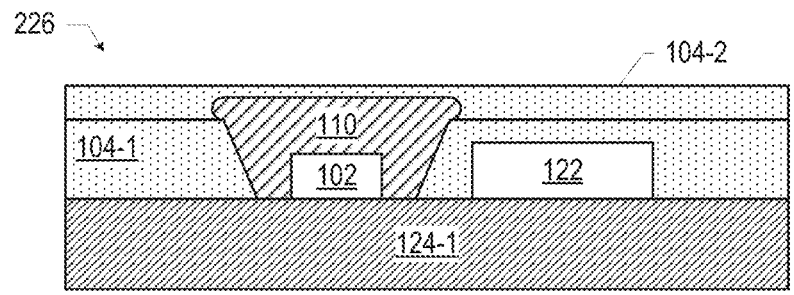

FIG. 2D illustrates an assembly 226 subsequent to forming a layer of dielectric material 104-2 on the top surface of the assembly 224 (FIG. 2C). The layer of dielectric material 104-2 may take the form of any of the embodiments of the layer of dielectric material 104-2 discussed above with reference to the assembly 214, but may be thicker than the layer of dielectric material 104-2 of the assembly 214. For example, in some embodiments, a thickness of the layer of dielectric material 104-2 of the assembly 226 may be between 10 microns and 30 microns (e.g., 20 microns).

Figure 2E:
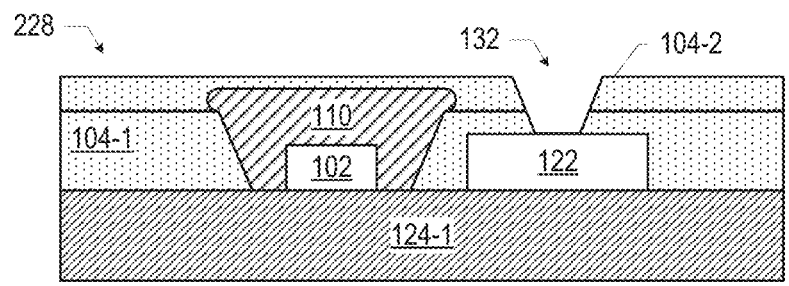

FIG. 2E illustrates an assembly 228 subsequent to forming a cavity 132 through the layer of dielectric material 104-2 and the layer of dielectric material 104-1 to expose a portion of the top surface of the conductive pad 122 of the assembly 226 (FIG. 2D). The cavity 132 of the assembly 228 may be formed in accordance with any of the embodiments of the cavity 132 discussed above with reference to the assembly 216.

Figure 2F:
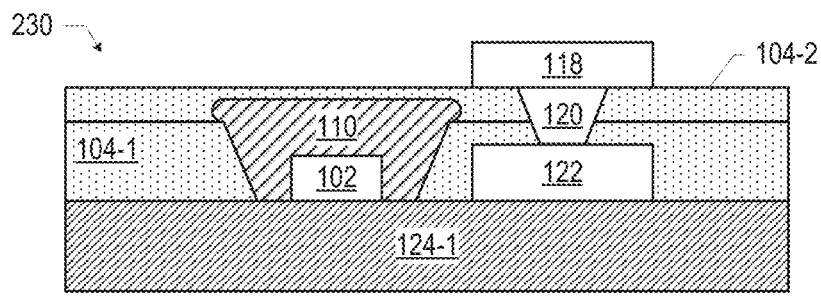

FIG. 2F illustrates an assembly 230 subsequent to forming a conductive via 120 in the cavity 132 of the assembly 228 (FIG. 2E), and also forming a conductive pad 118 on the conductive via 120. The conductive via 120 and the conductive pad 118 may be formed using any of the techniques discussed above with reference to FIG. 1J, for example. As also discussed above with reference to FIG. 1J, conductive lines (not shown) may be formed on the top surface of the layer of dielectric material 104-2 simultaneously with the formation of the conductive pad 118; these conductive lines may have a same thickness as the thickness of the conductive pad 118.

In the embodiments of FIGS. 1 and 2, the thickness of the conductive pad 122 (which is coplanar with the conductive line 102 around which the magnetic structure 110 is formed) is greater than the thickness of the conductive line 102. In other embodiments, the thickness of the conductive pad 122 may be equal to the thickness of the conductive line 102, thereby avoiding the round of photoresist patterning and conductive material deposition discussed above with reference to FIGS. 1C-1D. FIG. 3 illustrates stages in an example process of manufacturing a portion of an IC package support in which the conductive pad 122 and the conductive line 102 have equal thicknesses.

Figure 3A:
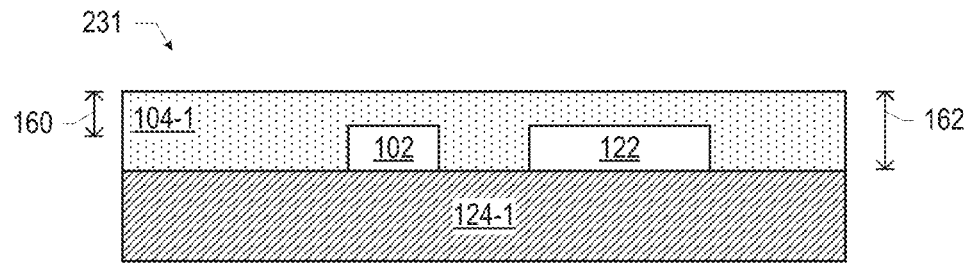
FIGS. 3A-3E illustrate stages in another example process of manufacturing a portion of an IC package support having a magnetic structure, in accordance with various embodiments.

FIG. 3A illustrates an assembly 231 subsequent to stripping the patterned photoresist 126-1 from the assembly 202 (FIG. 1B), and forming a layer of dielectric material 104-1 on the top surface of the resulting assembly. The portion 122A of FIG. 1B may provide the conductive pad 122 of the assembly 231. The layer of dielectric material 104-1 may be formed in accordance with any of the techniques disclosed herein (e.g., after a surface roughening operation). In some embodiments, the thickness 162 of the layer of dielectric material 104-1 may be between 35 microns and 55 microns, and the thickness 160 of the layer of dielectric material 104-1 above the top surface of the conductive line 102 may be between 10 microns and 30 microns (e.g., 20 microns).

Figure 3B:
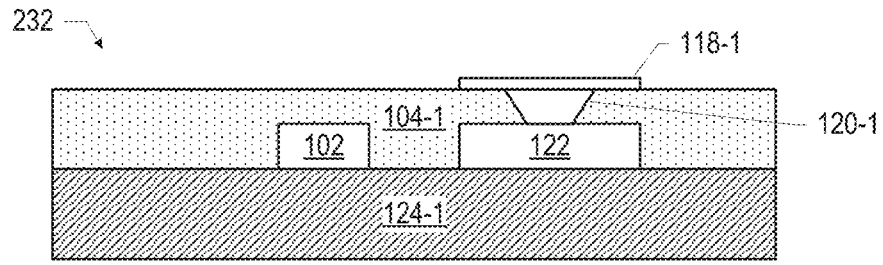

FIG. 3B illustrates an assembly 232 subsequent to forming a conductive via 120-1 through the layer of dielectric material 104-1 and in conductive contact with the conductive pad 122 of the assembly 231 (FIG. 3A), and forming a conductive pad 118-1 in conductive contact with the conductive via 120-1. The conductive via 120-1 and the conductive pad 118-1 may be formed in accordance with any of the techniques disclosed herein for forming the conductive via 120 and the conductive pad 118, respectively. In the embodiment illustrated in FIGS. 1 and 2, the conductive via 120 in conductive contact with the conductive pad 122 extended through the layers of dielectric material 104-1 and 104-2, while in the embodiment illustrated in FIG. 3B, the conductive via 120-1 in conductive contact with the conductive pad 122 extends only through the layer of dielectric material 104-1. The dimensions of the conductive via 120-1 and the conductive pad 118-1 may have any suitable values. For example, in some embodiments, the conductive via 120-1 may have a thickness between 10 microns and 30 microns (e.g., 20 microns), and the conductive pad 118-1 may have a thickness between 5 microns and 25 microns (e.g., 15 microns). Conductive lines (not shown) may be formed on the top surface of the layer of dielectric material 104-1 simultaneously with the formation of the conductive pad 118-1; these conductive lines may have the same thickness as the thickness of the conductive pad 118-1.

Figure 3C:
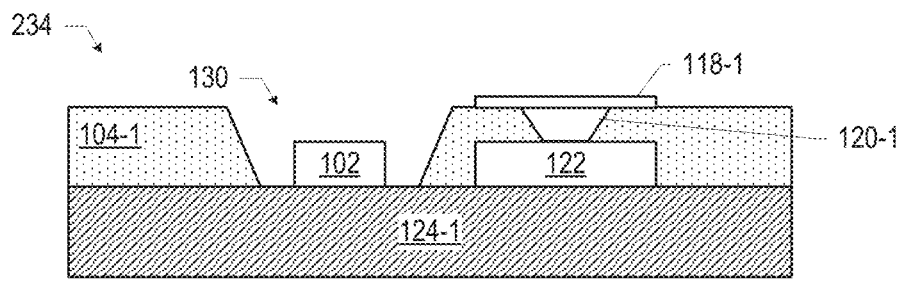

FIG. 3C illustrates an assembly 234 subsequent to forming a cavity 130 in the layer of dielectric material 104-1 of the assembly 232 (FIG. 3B). The cavity 130 of the assembly 234 may take the form of any of the embodiments of the cavity 130 of the assembly 210. In some embodiments, a desmear operation may be performed after forming the cavity 130.

Figure 3D:
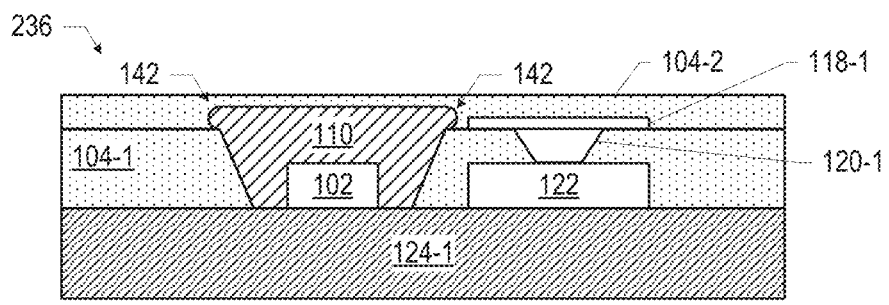

FIG. 3D illustrates an assembly 236 subsequent to forming a magnetic structure 110 in the cavity 130 of the assembly 234 (FIG. 3C), and then forming a layer of dielectric material 104-2 over the resulting assembly. The magnetic structure 110 may be formed by "overfilling" the cavity 130 with a magnetic paste in accordance with any of the embodiments discussed above with reference to FIG. 2C such that the magnetic structure 110 of FIG. 3D has a "muffin" shape, with a tapered portion at the bottom and a rounded portion 142 at the top. The layer of dielectric material 104-2 may take the form of any of the embodiments discussed above with reference to FIG. 2D.

Figure 3E:
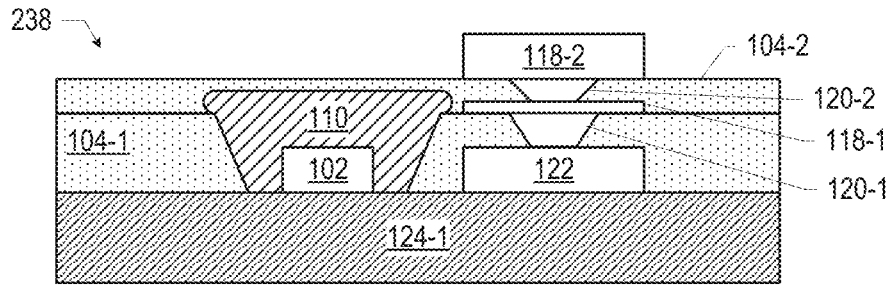

FIG. 3E illustrates an assembly 238 subsequent to forming a conductive via 120-2 through the layer of dielectric material 104-2 and in conductive contact with the conductive pad 118-1 of the assembly 236 (FIG. 3D), and forming a conductive pad 118-2 in conductive contact with the conductive via 120-2. The conductive via 120-2 and the conductive pad 118-2 may be formed in accordance with any of the techniques disclosed herein for forming the conductive via 120-1 and the conductive pad 118-1, respectively. In the embodiment illustrated in FIGS. 1 and 2, a single conductive via 120 extended through the layers of dielectric material 104-1 and 104-2, while in the embodiment illustrated in FIG. 3E, different conductive vias 120 extend through each of the different layers of dielectric material 104. The dimensions of the conductive via 120-2 and the conductive pad 118-2 may have any suitable values. For example, in some embodiments, the conductive via 120-2 may have a thickness between 5 microns and 25 microns (e.g., 15 microns), and the conductive pad 118-2 may have a thickness between 15 microns and 35 microns (e.g., 25 microns). Conductive lines (not shown) may be formed on the top surface of the layer of dielectric material 104-2 simultaneously with the formation of the conductive pad 118-2; these conductive lines may have a same thickness as the thickness of the conductive pad 118-2.

Figure 4:
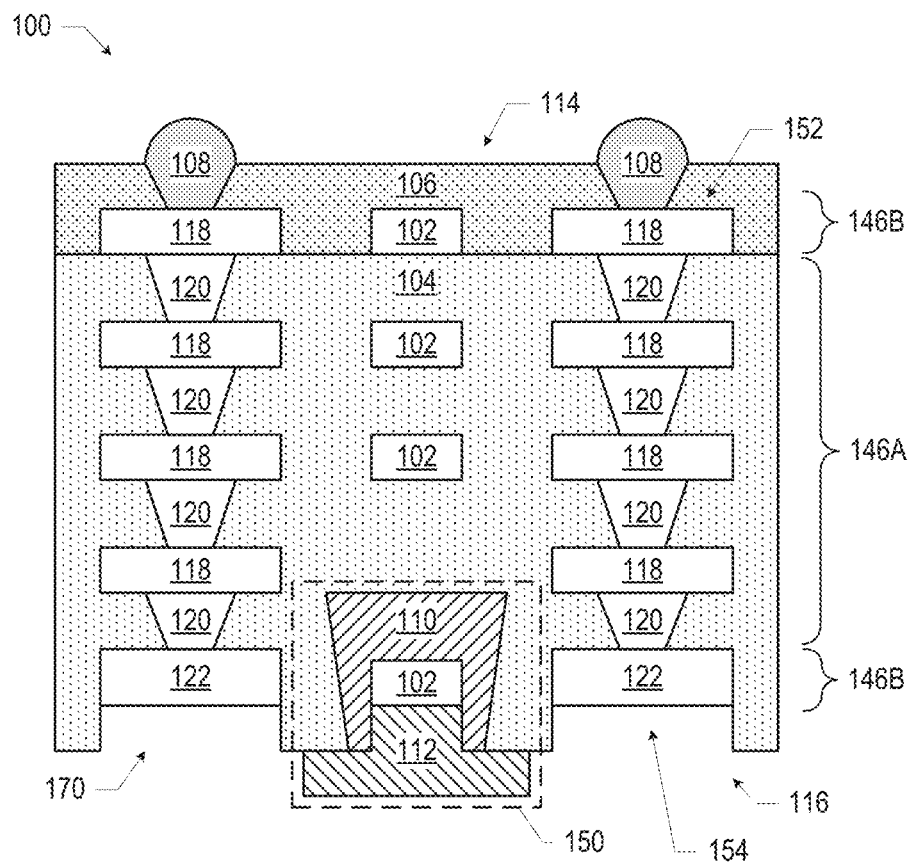
FIG. 4 is a side, cross-sectional view of an example IC package support including a magnetic structure, in accordance with various embodiments.

The magnetic structures 110 and related assemblies disclosed herein may be included in any suitable device. For example, FIG. 4 is a side, cross-sectional view of an example of an IC package support 100 that includes a magnetic structure 110. The magnetic structure 110 is illustrated in FIG. 4 is having a particular shape, but this is simply for illustrative purposes, and the magnetic structure 110 of FIG. 4 may take the form of any of the magnetic structures 110 disclosed herein. Further, although the conductive pads 122 proximate to the magnetic structure 110 are shown as being thicker than the conductive line 102 around which the magnetic structure 110 extends (e.g., as discussed above with reference to FIGS. 1 and 2), this is simply illustrative, and the conductive pads 122 of the IC package support 100 of FIG. 4 may have a same thickness as the conductive line 102 around which the magnetic structure 110 extends (e.g., as discussed above with reference to FIG. 3).

The IC package support 100 may have a first surface 114 and an opposing second surface 116, and may include a number of conductive pads 118 coupled by conductive vias 120, as well as conductive lines 102, distributed through the dielectric material 104. The dielectric material 104 of FIG. 4 may be provided by multiple layers of dielectric material (e.g., including the layers of dielectric material 104-1 and 104-2 discussed above). The conductive pads 118 and 122, the conductive vias 120, and the conductive lines 102 may provide electrical pathways through the IC package support 100. Conductive pads 118 disposed at the first surface 114 of the IC package support 100 may serve as conductive contacts 152 to couple the IC package support 100 to other components (not shown) via first-level interconnects 108 (e.g., solder bumps). For example, when the IC package support 100 is a package substrate, the first-level interconnects 108 may be electrically coupled to one or more dies, other active or passive devices, or an interposer. When the IC package support 100 is an interposer, the first-level interconnects 108 may be electrically coupled to one or more dies, other active or passive devices, or another interposer. In some embodiments in which the IC package support 100 is a package substrate, the package substrate may be coreless. A solder resist material 106 may be disposed around the conductive contacts 152. Conductive pads 122 disposed at the second surface 116 of the IC package support 100 may serve as conductive contacts 154 to couple the IC package support 100 to other components (not shown) via second-level interconnects (e.g., solder balls, not shown). For example, when the IC package support 100 is a package substrate, the conductive contacts 154 may couple the IC package support 100 to a circuit board (e.g., a motherboard). When the IC package support 100 is an interposer, the conductive contacts 154 may couple the IC package support 100 to another interposer or a package substrate. The conductive contacts 154 may be set back from the surface of the dielectric material 104 at the second surface 116 by pockets 170; in some embodiments, these pockets 170 may accommodate solder balls as the second-level interconnects in a ball grid array (BGA) arrangement.

The magnetic structure 110 of FIG. 4 has a tapered shape, narrowing toward and extending around top and side surfaces of a conductive line 102. The conductive line 102 around which the magnetic structure 110 extends may be substantially coplanar with the conductive pads 122, as shown. Another magnetic structure 112 may be proximate to the bottom surface of the conductive line 102 around which the magnetic structure 110 extends; together, the magnetic structure 110 and the magnetic structure 112 may substantially surround the conductive line 102. The conductive line 102, the magnetic structure 110, and the magnetic structure 112 may together provide an example of an ACI 150. The IC package support 100 of FIG. 4 may have interior layers 146A and exterior layers 146B. In the embodiment of FIG. 4, the ACI 150 is in an exterior layer 146B, proximate to the second surface 116. In other embodiments, the ACI 150 may be in an interior layer 146A (e.g., as discussed below with reference to FIG. 6).

The IC package support 100 of FIG. 4 may be manufactured in accordance with any suitable technique. For example, FIGS. 5A-5E illustrate stages in an example process of manufacturing the IC package support 100 of FIG. 4, in accordance with various embodiments.

Figure 5A:
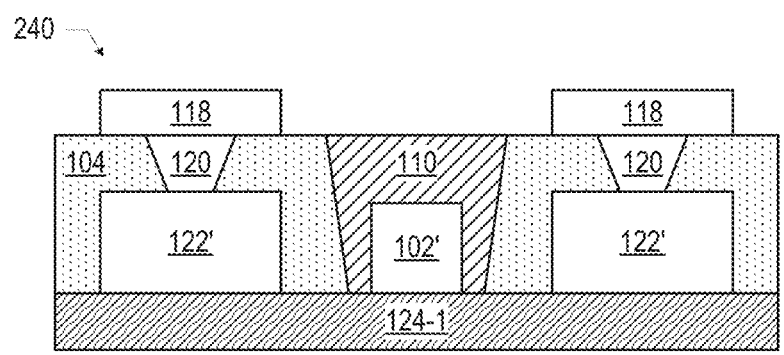
FIGS. 5A-5E illustrate stages in an example process of manufacturing the IC package support of FIG. 4, in accordance with various embodiments.

FIG. 5A illustrates an assembly 240 including a carrier 124-1 supporting an initial conductive line 102', initial conductive pads 122', conductive vias 120, and conductive pads 118 in a dielectric material 104. The assembly 240 may be manufactured in accordance with any of the techniques disclosed herein; for example, the assembly 240 may have the structure of the assembly 218 of FIG. 1J, the structure of the assembly 230 of FIG. 2F, or the structure of the assembly 238 of FIG. 3E. The initial conductive line 102' and the initial conductive pads 122' may have thicknesses greater than the thicknesses of the conductive lines 102 and the conductive pads 122 in these assemblies; as discussed further below with reference to FIG. 5D, some of the material of the initial conductive line 102' and the initial conductive pads 122' may be removed to form the conductive line 102 and the conductive pads 122.

Figure 5B:
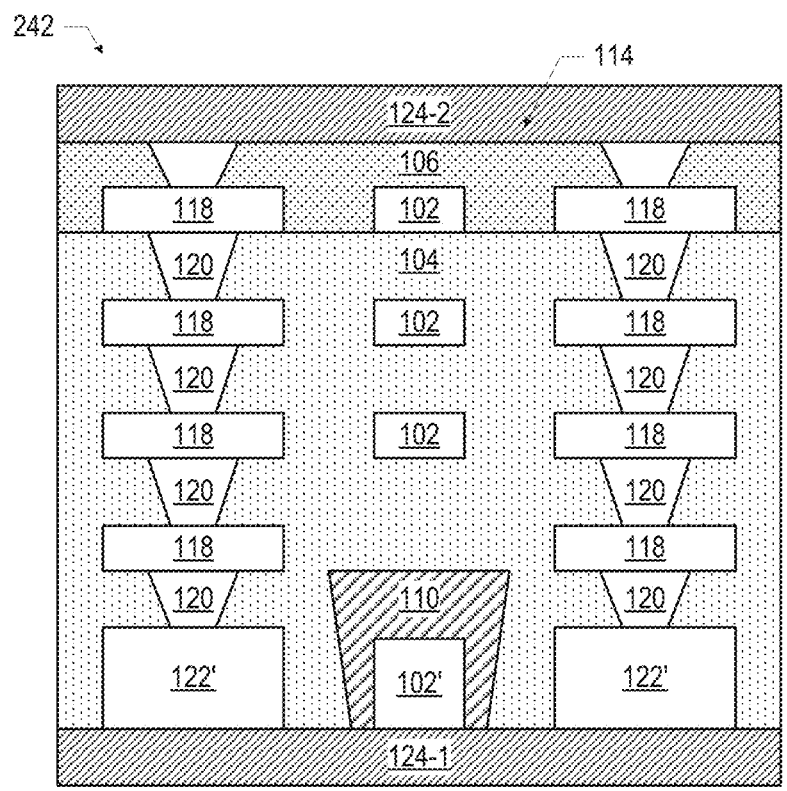

FIG. 5B illustrates an assembly 242 subsequent to forming additional structures on the assembly 240 (FIG. 5A) and providing a carrier 124-2 on the resulting assembly. These additional structures include additional vias 120, conductive pads 118, conductive lines 102, and dielectric material 104, as well as solder resist material 106. The structures may be formed using the techniques disclosed herein and techniques known in the art. The carrier 124-2 may take any suitable form.

Figure 5C:
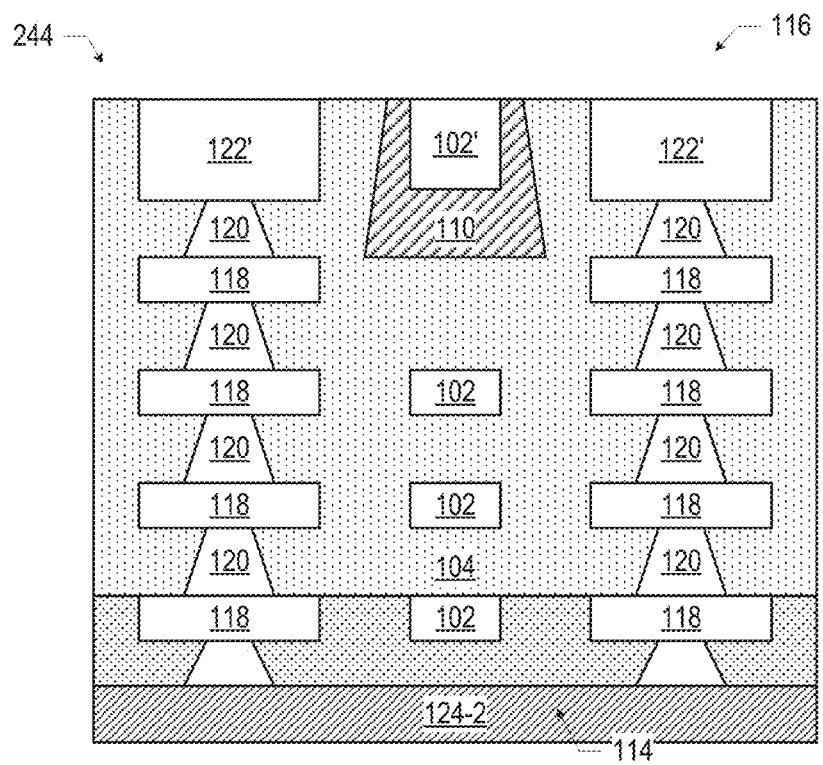

FIG. 5C illustrates an assembly 244 subsequent to removing the carrier 124-1 of the assembly 242 (FIG. 5B) and "flipping" the resulting assembly. The conductive pads 122' and the conductive line 102' around which the magnetic structure 110 extends may be exposed at the second surface 116.

Figure 5D:
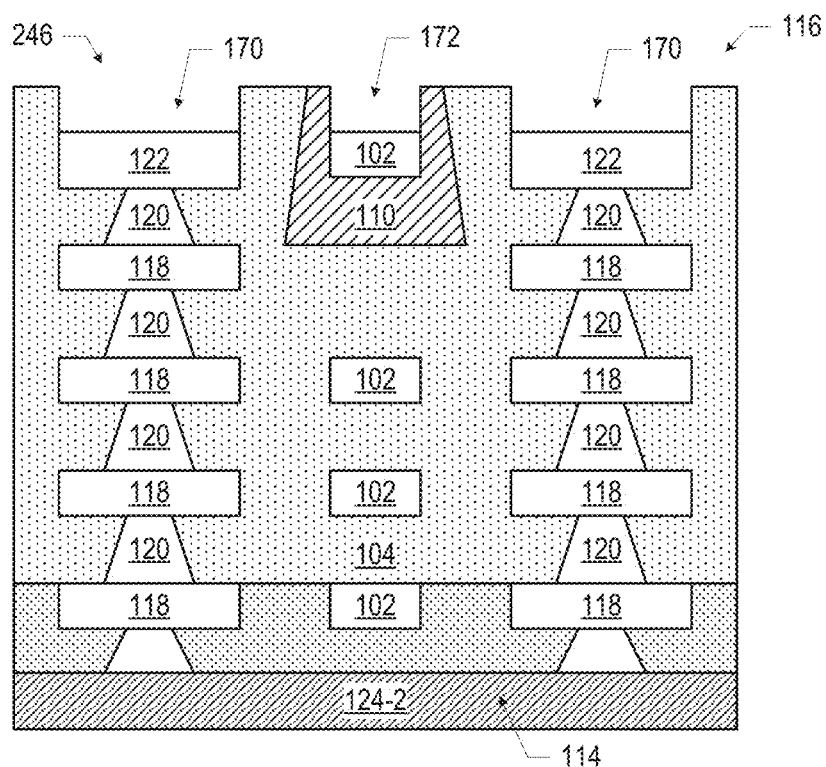

FIG. 5D illustrates an assembly 246 subsequent to recessing (e.g., by etching) the conductive pads 122' and the conductive line 102' at the second surface 116 of the assembly 244 (FIG. 5C) to form the conductive pads 122 and the conductive line 102, respectively. This recessing may form pockets 170 proximate to the conductive pads 122, and a pocket 172 proximate to the conductive line 102. The pocket 172 may have side surfaces provided by the magnetic structure 110, as shown. The depth of the recessing may be selected to achieve a desired thickness for the conductive pads 122 and the conductive line 102.

Figure 5E:
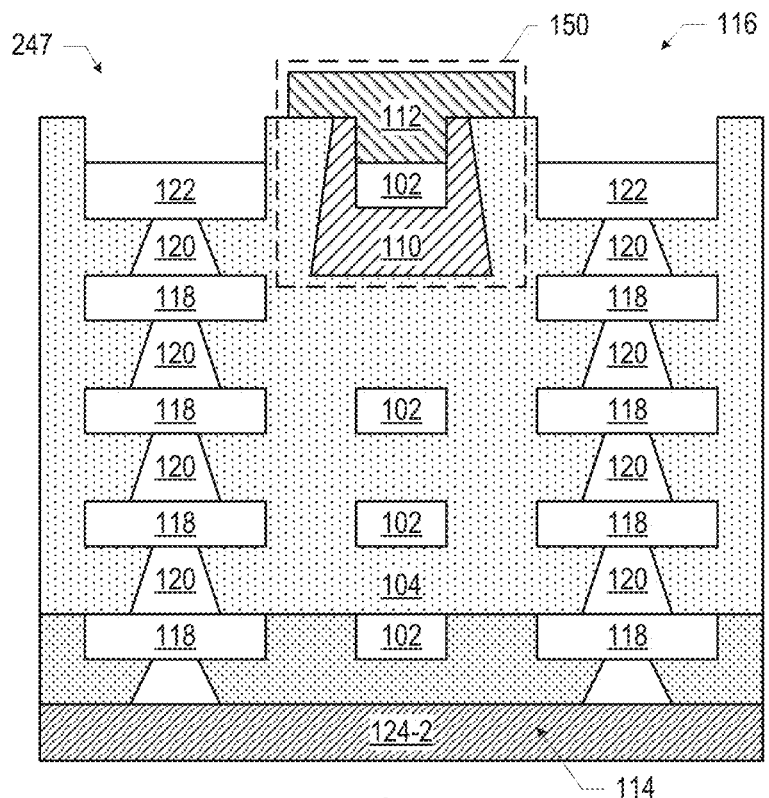

FIG. 5E illustrates an assembly 247 subsequent to forming an additional magnetic structure 112 at the second surface 116 of the assembly 246 (FIG. 5D). The additional magnetic structure 112 may have a "T"-shape in cross-section, and may extend into the pocket 172 and over the exposed magnetic structure 110 and dielectric material 104 at the second surface 116. In some embodiments, the magnetic structure 112 may be formed using a magnetic ink. The carrier 124-2 may be removed from the assembly 247, and first-level interconnects 108 may be formed to yield the IC package support 100 of FIG. 4.

Figure 6:
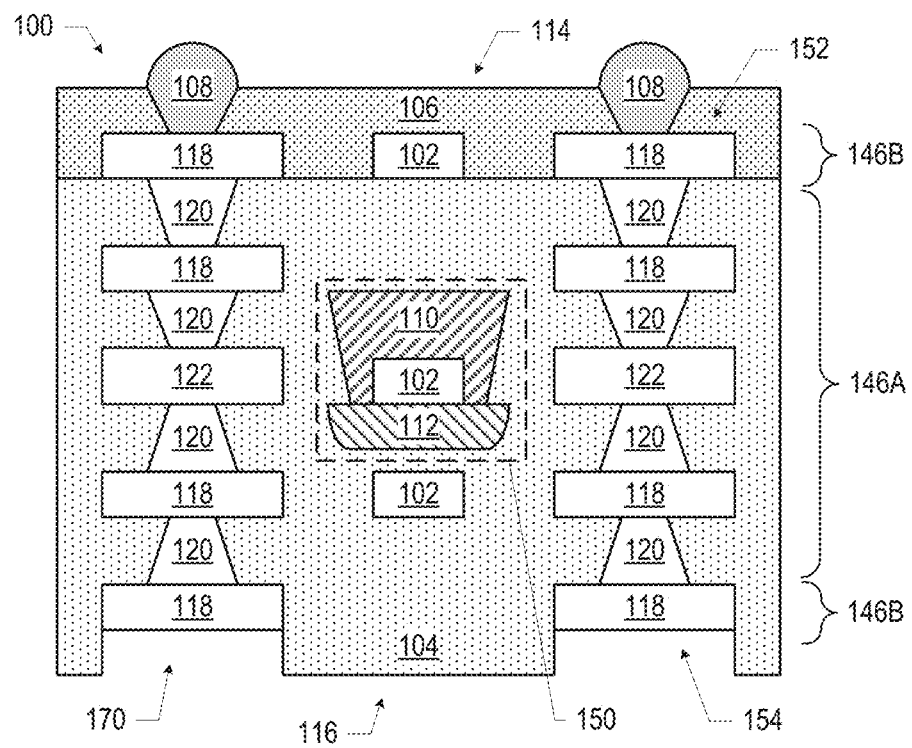
FIG. 6 is a side, cross-sectional view of an example IC package support including a magnetic structure, in accordance with various embodiments.

As noted above, in some embodiments, the magnetic structure 110 may be located in an interior layer 146A of an IC package support 100. FIG. 6 illustrates such an embodiment, and shares a number of features with the IC package support 100 of FIG. 4; the shared features may take the form of any of the embodiments discussed herein, and are not repeated for ease of illustration. In the IC package support 100 of FIG. 6, the vias 120 in layers on opposite sides of the magnetic structure 110 are flipped with respect to each other; vias 120 between the layer of the magnetic structure 110 and the first surface 114 narrow toward the second surface 116, while vias 120 between the layer of the magnetic structure 110 and the second surface 116 narrow toward the first surface 114. As noted above with reference to FIG. 4, the magnetic structure 110 is illustrated in FIG. 6 is having a particular shape, but this is simply for illustrative purposes, and the magnetic structure 110 of FIG. 6 may take the form of any of the magnetic structures 110 disclosed herein. Further, although the conductive pads 122 proximate to the magnetic structure 110 of FIG. 6 are shown as being thicker than the conductive line 102 around which the magnetic structure 110 extends (e.g., as discussed above with reference to FIGS. 1 and 2), this is simply illustrative, and the conductive pads 122 of the IC package support 100 of FIG. 6 may have a same thickness as the conductive line 102 around which the magnetic structure 110 extends (e.g., as discussed above with reference to FIG. 3).

The magnetic structure 110 of FIG. 6 has a tapered shape, narrowing toward and extending around top and side surfaces of a conductive line 102. The conductive line 102 around which the magnetic structure 110 extends may be substantially coplanar with the conductive pads 122, as shown. In FIG. 6, another magnetic structure 112 may be proximate to the bottom surface of the conductive line 102 around which the magnetic structure 110 extends; together, the magnetic structure 110 and the magnetic structure 112 may substantially surround the conductive line 102 and may provide an ACI 150. In the embodiment of FIG. 6, the ACI 150 is in an interior layer 146A.

The IC package support 100 of FIG. 6 may be manufactured in accordance with any suitable technique. For example, FIGS. 7A-7D illustrate stages in an example process of manufacturing the IC package support 100 of FIG. 6, in accordance with various embodiments.

Figure 7A:
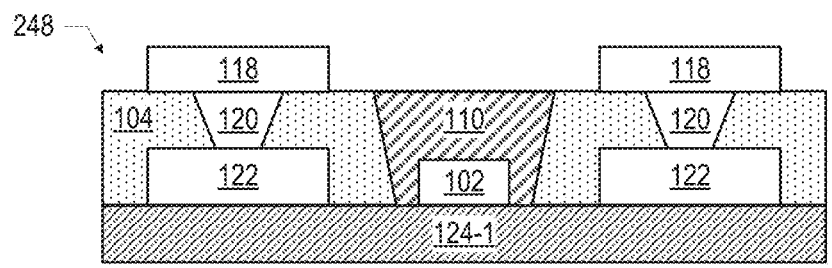
FIGS. 7A-7D illustrate stages in an example process of manufacturing the IC package support of FIG. 6, in accordance with various embodiments.

FIG. 7A illustrates an assembly 248 including a carrier 124-1 supporting a conductive line 102, conductive pads 122, conductive vias 120, and conductive pads 118 in a dielectric material 104. The assembly 248 may be manufactured in accordance with any of the techniques disclosed herein; for example, the assembly 248 may have the structure of the assembly 218 of FIG. 1J, the structure of the assembly 230 of FIG. 2F, or the structure of the assembly 238 of FIG. 3E.

Figure 7B:
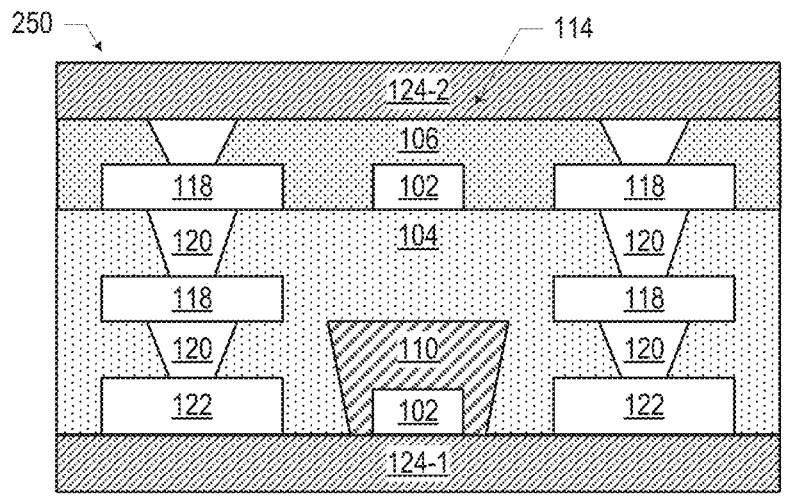

FIG. 7B illustrates an assembly 250 subsequent to forming additional structures on the assembly 248 (FIG. 7A), and then providing an additional carrier 124-2 at the top surface of the resulting assembly. These additional structures include additional vias 120, conductive pads 118, conductive lines 102, and dielectric material 104, as well as solder resist material 106. The structures may be formed using the techniques disclosed herein and techniques known in the art, and the carrier 124-2 may take any suitable form.

Figure 7C:
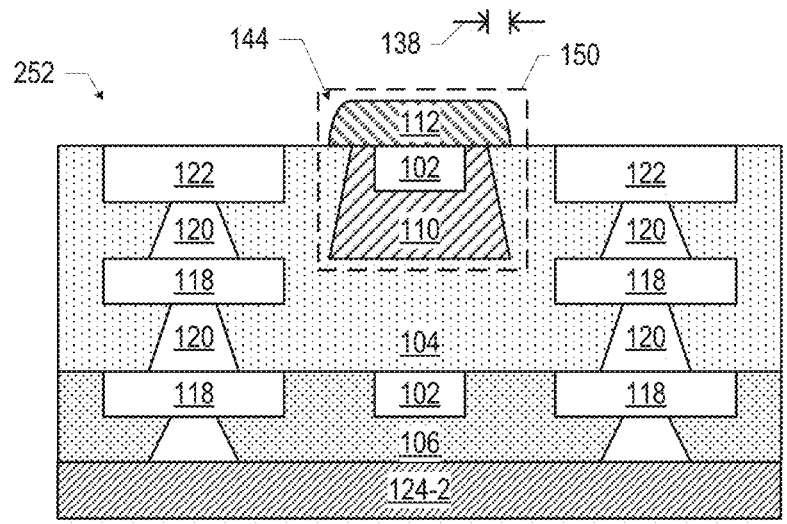

FIG. 7C illustrates an assembly 252 subsequent to removing the carrier 124-1 of the assembly 250 (FIG. 7B), "flipping" the resulting assembly, and then forming an additional magnetic structure 112 at the exposed surface. After removing the carrier 124-1, the conductive pads 122, and the conductive line 102 around which the magnetic structure 110 extends, may be exposed. The additional magnetic structure 112 may cover the exposed "bottom" surface of the conductive line 102 and may extend over the proximate magnetic structure 110 and dielectric material 104. The magnetic structure 112 may be formed using any suitable technique. For example, the magnetic structure 112 may be formed by stencil printing, in which a mask is placed over the top surface of the assembly 252 with an opening over the conductive line 102, a magnetic paste is distributed over the mask, and a squeegee is used to push the magnetic paste into the opening of the mask, after which the mask may be removed. In some embodiments, the magnetic structure 112 may have rounded shoulders 144, with a shoulder length 138 between 60 microns and 80 microns (e.g., 70 microns).

Figure 7D:
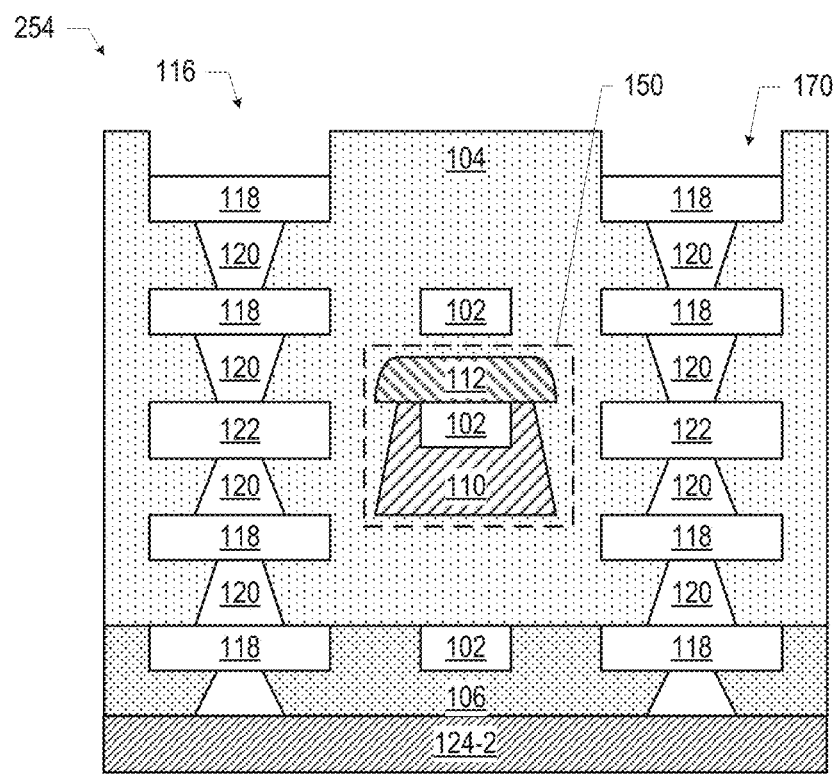

FIG. 7D illustrates an assembly 254 subsequent to forming additional structures on the assembly 252 (FIG. 7C). These additional structures include additional vias 120, conductive pads 118, conductive lines 102, and dielectric material 104. Conductive pads 118 at the second surface 116 of the assembly 254 may be recessed as discussed above with reference to FIG. 5D. The carrier 124-2 may be removed from the assembly 254, and first-level interconnects 108 may be formed to yield the IC package support 100 of FIG. 6.

The IC package supports 100 disclosed herein may be included in any suitable electronic component. FIGS. 8-12 illustrate various examples of apparatuses that may include any of the IC package supports 100 disclosed herein, or may be included in an IC package that also includes any of the IC package supports 100 disclosed herein.

Figure 8:
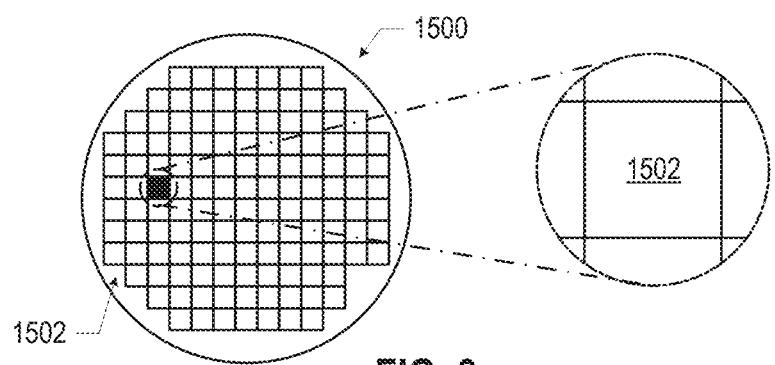
FIG. 8 is a top view of a wafer and dies that may be included in an IC package having an IC package support in accordance with any of the embodiments disclosed herein.

FIG. 8 is a top view of a wafer 1500 and dies 1502 that may be included in an IC package including one or more IC package supports 100 (e.g., as discussed below with reference to FIG. 10) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 9, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 12) or other logic that is configured to store information in the memory devices or execute instructions stored in the memory array.

Figure 9:
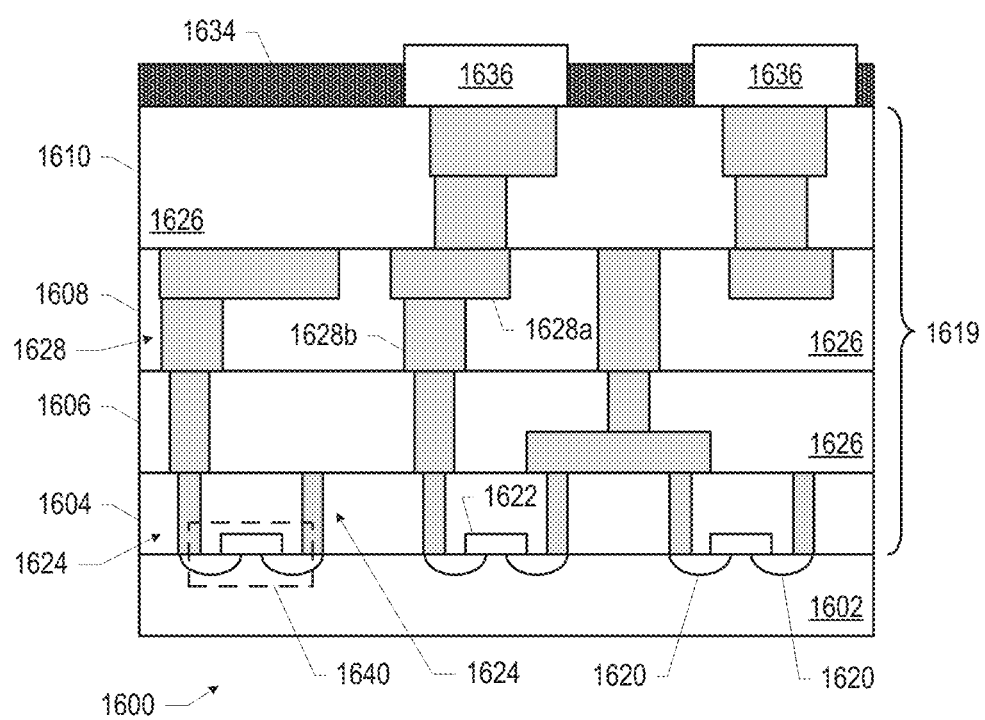
FIG. 9 is a side, cross-sectional view of an IC device that may be included in an IC package having an IC package support in accordance with any of the embodiments disclosed herein.

FIG. 9 is a side, cross-sectional view of an IC device 1600 that may be included in an IC package including one or more IC package supports 100 (e.g., as discussed below with reference to FIG. 10), in accordance with any of the embodiments disclosed herein. One or more of the IC devices 1600 may be included in one or more dies 1502 (FIG. 8). The IC device 1600 may be formed on a substrate 1602 (e.g., the wafer 1500 of FIG. 8) and may be included in a die (e.g., the die 1502 of FIG. 8). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 8) or a wafer (e.g., the wafer 1500 of FIG. 8).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an 164/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form cavities at the locations of the S/D regions 1620. An epitaxial deposition process may then be carried out to fill the cavities with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 9). Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 9. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 10:
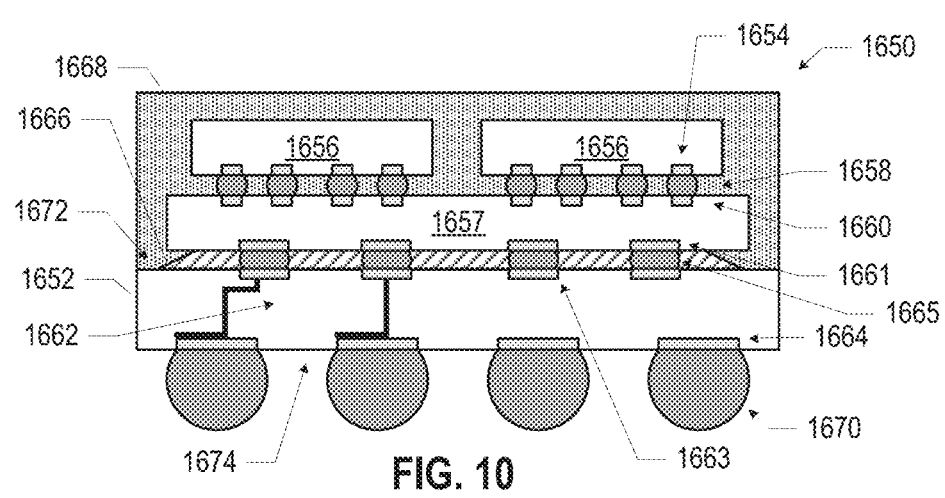
FIG. 10 is a side, cross-sectional view of an IC package that may include any of the IC package supports disclosed herein.

FIG. 10 is a side, cross-sectional view of an example IC package 1650 that may include one or more IC package supports 100, in accordance with any of the embodiments disclosed herein. For example, the package substrate 1652 and/or the interposer 1657 may be an IC package support 100, in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, etc.), and may have conductive pathways extending through the dielectric material between the surface 1672 and the surface 1674, or between different locations on the surface 1672, and/or between different locations on the surface 1674. These conductive pathways may take the form of any of the interconnects 1628 discussed above with reference to FIG. 9.

The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown). In embodiments in which the package substrate 1652 is an IC package support 100, the conductive contacts 1663 may be the conductive contacts 152, and the conductive contacts 1664 may be the conductive contacts 154.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 10 are solder bumps, but any suitable first-level interconnects 1665 may be used. In embodiments in which the interposer 1657 is an IC package support 100, the conductive contacts 1660 may be the conductive contacts 152, and the conductive contacts 1661 may be the conductive contacts 154. In some embodiments, no interposer 1657 may be included in the IC package 1650; instead, the dies 1656 may be coupled directly to the conductive contacts 1663 at the surface 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 10 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 10 are solder balls (e.g., for a BGA arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 11.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 10 is a flip chip package, other package architectures may be used. For example, the IC package 1650 may be a BGA package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 10, an IC package 1650 may include any desired number of dies 1656. An IC package 1650 may include additional passive components, such as surface-mount resistors, capacitors, and inductors disposed on the first surface 1672 or the second surface 1674 of the package substrate 1652, or on either surface of the interposer 1657. More generally, an IC package 1650 may include any other active or passive components known in the art.

Figure 11:
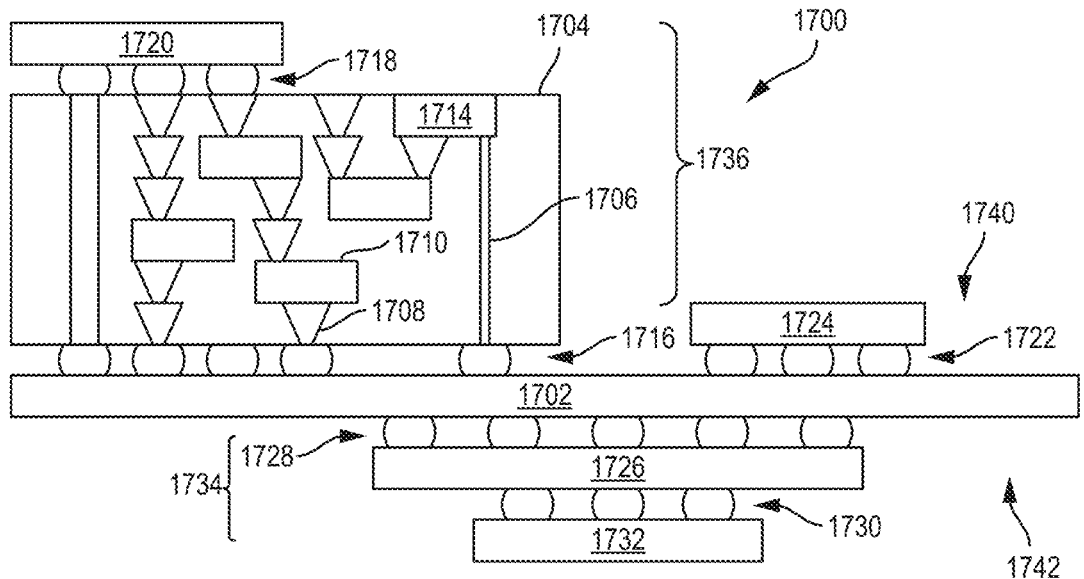
FIG. 11 is a side, cross-sectional view of an IC device assembly that may include an IC package support in accordance with any of the embodiments disclosed herein.

FIG. 11 is a side, cross-sectional view of an IC device assembly 1700 that may include one or more IC package supports 100, in accordance with any of the embodiments disclosed herein. The IC device assembly 1700 includes a number of components disposed on a circuit board 1702 (which may be, e.g., a motherboard). The IC device assembly 1700 includes components disposed on a first surface 1740 of the circuit board 1702 and an opposing second surface 1742 of the circuit board 1702; generally, components may be disposed on one or both surfaces 1740 and 1742. Any of the IC packages discussed below with reference to the IC device assembly 1700 may take the form of any of the embodiments of the IC package 1650 discussed above with reference to FIG. 10 (e.g., may include one or more IC package supports 100 as a package substrate 1652 or an interposer 1657).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 11 includes a package-on-interposer structure 1736 coupled to the first surface 1740 of the circuit board 1702 by coupling components 1716. The coupling components 1716 may electrically and mechanically couple the package-on-interposer structure 1736 to the circuit board 1702, and may include solder balls (as shown in FIG. 11), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 11, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 11, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first surface 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 11 includes a package-on-package structure 1734 coupled to the second surface 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 12:
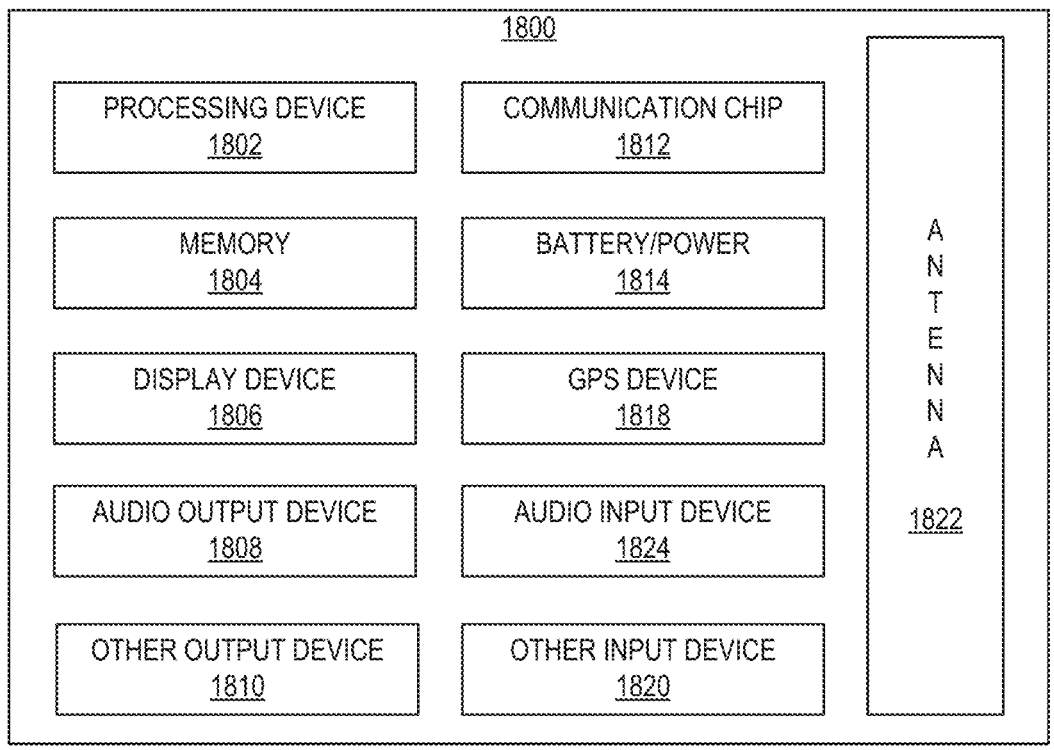
FIG. 12 is a block diagram of an example electrical device that may include an IC package support in accordance with any of the embodiments disclosed herein.

FIG. 12 is a block diagram of an example electrical device 1800 that may include one or more IC package supports 100, in accordance with any of the embodiments disclosed herein. Any suitable ones of the components of the electrical device 1800 may include one or more of the IC device assemblies 1700, IC packages 1650, IC devices 1600, or dies 1502 disclosed herein. A number of components are illustrated in FIG. 12 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 12, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a conductive line; and a magnetic structure around a top surface of the conductive line and side surfaces of the conductive line, wherein the magnetic structure has a tapered shape that narrows toward the conductive line.

Example 2 includes the subject matter of Example 1, and further specifies that the magnetic structure includes a magnetic particles embedded in a polymer matrix.

Example 3 includes the subject matter of any of Examples 1-2, and further specifies that the magnetic structure has a thickness above the top surface of the conductive line between 30 microns and 50 microns.

Example 4 includes the subject matter of any of Examples 1-3, and further specifies that the conductive line has a thickness between 20 microns and 30 microns.

Example 5 includes the subject matter of any of Examples 1-4, and further specifies that the magnetic structure tapers by a distance between 5 microns and 15 microns.

Example 6 includes the subject matter of any of Examples 1-5, and further includes: a layer of dielectric material at a top surface of the magnetic structure.

Example 7 includes the subject matter of Example 6, and further specifies that the layer of dielectric material has a thickness over the top surface of the magnetic structure between 5 microns and 10 microns.

Example 8 includes the subject matter of any of Examples 6-7, and further specifies that the layer of dielectric material includes an organic, polymer-based dielectric.

Example 9 includes the subject matter of any of Examples 1-8, and further specifies that the magnetic structure has a rounded portion at a top surface of the magnetic structure.

Example 10 includes the subject matter of any of Examples 1-9, and further includes: a first layer of dielectric material, wherein the magnetic structure is at least partially embedded in the first layer of dielectric material; a conductive pad at least partially embedded in the first layer of dielectric material; a second layer of dielectric material in contact with a top surface of the magnetic structure; and a conductive via in conductive contact with the conductive pad, wherein the conductive via extends through the first layer of dielectric material.

Example 11 includes the subject matter of Example 10, and further specifies that the conductive via also extends through the second layer of dielectric material.

Example 12 includes the subject matter of Example 10, and further specifies that the conductive via does not extend through the second layer of dielectric material.

Example 13 includes the subject matter of Example 12, and further specifies that the conductive via is a first conductive via, the IC package support further includes a second conductive via, the first conductive via is between the second conductive via and the conductive pad, and the second conductive via extends through the second layer of dielectric material.

Example 14 includes the subject matter of any of Examples 10-13, and further specifies that a thickness of the conductive pad is greater than a thickness of the conductive line.

Example 15 includes the subject matter of any of Examples 10-14, and further specifies that a thickness of the conductive pad is between 20 microns and 50 microns.

Example 16 includes the subject matter of any of Examples 10-15, and further specifies that the first layer of dielectric material has a thickness between 35 microns and 75 microns.

Example 17 includes the subject matter of any of Examples 10-16, and further specifies that the second layer of dielectric material has a thickness between 20 microns and 40 microns.

Example 18 includes the subject matter of any of Examples 1-17, and further specifies that the magnetic structure is a first magnetic structure, and the IC package support further includes: a second magnetic structure at a bottom surface of the conductive line.

Example 19 includes the subject matter of Example 18, and further specifies that the second magnetic structure has rounded shoulder portions.

Example 20 includes the subject matter of any of Examples 1-19, and further specifies that the conductive line is in an interior layer of the IC package support.

Example 21 includes the subject matter of any of Examples 1-19, and further specifies that the conductive line is in an exterior layer of the IC package support.

Example 22 includes the subject matter of any of Examples 1-21, and further specifies that the IC package support is a package substrate.

Example 23 includes the subject matter of any of Examples 1-21, and further specifies that the IC package support is an interposer.

Example 24 includes the subject matter of any of Examples 1-23, and further specifies that the conductive line and magnetic structure are part of an air core inductor (ACI).

Example 25 includes the subject matter of Example 24, and further specifies that the IC package support includes a plurality of ACIs.

Example 26 is an electronic assembly, including: an integrated circuit (IC) package support, including a magnetic structure in a tapered cavity in a layer of dielectric material.

Example 27 includes the subject matter of Example 26, and further specifies that the magnetic structure is around a top surface and side surfaces of a conductive line.

Example 28 includes the subject matter of Example 27, and further specifies that the magnetic structure has a tapered shape that narrows toward the conductive line.

Example 29 includes the subject matter of any of Examples 27-28, and further specifies that the conductive line has a thickness between 20 microns and 30 microns.

Example 30 includes the subject matter of any of Examples 27-29, and further specifies that the magnetic structure is a first magnetic structure, and the IC package support further includes: a second magnetic structure at a bottom surface of the conductive line.

Example 31 includes the subject matter of Example 30, and further specifies that the second magnetic structure has rounded shoulder portions.

Example 32 includes the subject matter of any of Examples 27-31, and further specifies that the magnetic structure has a thickness above the top surface of the conductive line between 30 microns and 50 microns.

Example 33 includes the subject matter of any of Examples 26-32, and further specifies that the magnetic structure includes a magnetic particles embedded in a polymer matrix.

Example 34 includes the subject matter of any of Examples 26-33, and further specifies that the magnetic structure tapers by a distance between 5 microns and 15 microns.

Example 35 includes the subject matter of any of Examples 26-34, and further specifies that the IC package support further includes: a layer of dielectric material at a top surface of the magnetic structure.

Example 36 includes the subject matter of Example 35, and further specifies that the layer of dielectric material has a thickness over the top surface of the magnetic structure between 5 microns and 10 microns.

Example 37 includes the subject matter of any of Examples 34-36, and further specifies that the layer of dielectric material includes an organic, polymer-based dielectric.

Example 38 includes the subject matter of any of Examples 26-37, and further specifies that the magnetic structure has a rounded portion at a top surface of the magnetic structure.

Example 39 includes the subject matter of any of Examples 26-38, and further specifies that the IC package support further includes: a first layer of dielectric material, wherein the magnetic structure is at least partially embedded in the first layer of dielectric material; a conductive pad at least partially embedded in the first layer of dielectric material; a second layer of dielectric material in contact with a top surface of the magnetic structure; and a conductive via in conductive contact with the conductive pad, wherein the conductive via extends through the first layer of dielectric material.

Example 40 includes the subject matter of Example 39, and further specifies that the conductive via also extends through the second layer of dielectric material.

Example 41 includes the subject matter of Example 39, and further specifies that the conductive via does not extend through the second layer of dielectric material.

Example 42 includes the subject matter of Example 41, and further specifies that the conductive via is a first conductive via, the IC package support further includes a second conductive via, the first conductive via is between the second conductive via and the conductive pad, and the second conductive via extends through the second layer of dielectric material.

Example 43 includes the subject matter of any of Examples 39-42, and further specifies that a thickness of the conductive pad is between 20 microns and 50 microns.

Example 44 includes the subject matter of any of Examples 39-43, and further specifies that the first layer of dielectric material has a thickness between 35 microns and 75 microns.

Example 45 includes the subject matter of any of Examples 39-44, and further specifies that the second layer of dielectric material has a thickness between 20 microns and 40 microns.

Example 46 includes the subject matter of any of Examples 26-45, and further specifies that the magnetic structure is in an interior layer of the IC package support.

Example 47 includes the subject matter of any of Examples 26-45, and further specifies that the magnetic structure is in an exterior layer of the IC package support.

Example 48 includes the subject matter of any of Examples 26-47, and further specifies that the IC package support is a package substrate.

Example 49 includes the subject matter of any of Examples 26-47, and further specifies that the IC package support is an interposer.

Example 50 includes the subject matter of any of Examples 26-49, and further specifies that the IC package support further includes conductive contacts and the electronic assembly further includes one or more dies coupled to the conductive contacts.

Example 51 includes the subject matter of any of Examples 26-50, and further specifies that the IC package support is included in an IC package, the electronic assembly further includes a circuit board, and the IC package is coupled to the circuit board.

Example 52 includes the subject matter of any of Examples 26-51, and further includes: an antenna.

Example 53 includes the subject matter of any of Examples 26-52, and further specifies that the magnetic structure is part of an air core inductor (ACI).

Example 54 includes the subject matter of Example 53, and further specifies that the IC package support includes a plurality of ACIs.

Example 55 is an integrated circuit (IC) package, including: a package substrate including an air core inductor, wherein the air core inductor includes a conductive line and a magnetic structure at least partially around the conductive line, and wherein the magnetic structure is narrower closer to a bottom surface of the conductive line; and one or more dies coupled to the package substrate.

Example 56 includes the subject matter of Example 55, and further specifies that the package substrate includes a plurality of air core inductors.

Example 57 includes the subject matter of any of Examples 55-56, and further specifies that the air core inductor is proximate to second-level interconnects of the package substrate.

Example 58 includes the subject matter of any of Examples 55-56, and further specifies that the air core inductor is in an interior layer of the package substrate.

Example 59 includes the subject matter of any of Examples 55-58, and further specifies that the magnetic structure includes a magnetic particles embedded in a polymer matrix.

Example 60 includes the subject matter of any of Examples 55-59, and further specifies that the magnetic structure has a thickness above a top surface of the conductive line between 30 microns and 50 microns.

Example 61 is a method of manufacturing an integrated circuit (IC) package support, including: forming a layer of dielectric material; forming a tapered cavity in the layer of dielectric material; and forming a magnetic paste into the tapered cavity.

Example 62 includes the subject matter of Example 61, and further specifies that the layer of dielectric material includes an organic, polymer-based film.

Example 63 includes the subject matter of any of Examples 61-62, and further specifies that forming the tapered cavity exposes a conductive line at a bottom of the tapered cavity.

Example 64 includes the subject matter of any of Examples 61-63, and further specifies that depositing the magnetic paste includes stencil printing the magnetic paste.

Example 65 includes the subject matter of any of Examples 61-64, and further specifies that forming the tapered cavity includes laser skiving the layer of dielectric material.

Example 66 includes the subject matter of any of Examples 61-65, and further specifies that the layer of dielectric material is a first layer of dielectric material, and the method further includes: after forming the magnetic paste, forming a second layer of dielectric material over the magnetic paste.

Example 67 includes the subject matter of Example 66, and further specifies that the second layer of dielectric material has a thickness between 5 microns and 10 microns.

Example 68 includes the subject matter of Example 66, and further specifies that the second layer of dielectric material has a thickness between 15 microns and 50 microns.

Example 69 includes the subject matter of any of Examples 66-68, and further specifies that the tapered cavity is a first tapered cavity, and the method further includes: forming a second tapered cavity in the first layer of dielectric material and the second layer of dielectric material; and forming a conductive material in the second tapered cavity.

Example 70 includes the subject matter of Example 69, and further specifies that the second tapered cavity exposes a conductive pad at a bottom of the second tapered cavity.

Example 71 includes the subject matter of any of Examples 61-70, and further specifies that the tapered cavity is a first tapered cavity, and the method further includes: after forming the layer of dielectric material, forming a second tapered cavity in the layer of dielectric material, wherein a conductive pad is exposed at a bottom of the second tapered cavity; forming a conductive material in the second tapered cavity; and after forming the conductive material in the second tapered cavity, forming a second layer of dielectric material over the magnetic paste.

Example 72 includes the subject matter of Example 71, and further includes: after forming the second layer of dielectric material, forming a third tapered cavity in the second layer of dielectric material.

Example 73 includes the subject matter of any of Examples 61-72, and further specifies that a top surface of the magnetic paste is coplanar with a top surface of the layer of dielectric material.

Example 74 includes the subject matter of any of Examples 61-72, and further specifies that a top surface of the magnetic paste is above a top surface of the layer of dielectric material.

Example 75 includes the subject matter of any of Examples 61-72, and further specifies that the magnetic paste extends out of the tapered cavity and onto a top surface of the layer of dielectric material.

The invention claimed is:

1. An integrated circuit (IC) package support, comprising:
   a conductive line; and
   a magnetic structure on a top surface and on side surfaces of the conductive line, wherein the magnetic structure has a rounded portion at a top surface of the magnetic structure.

2. The IC package support of claim 1, wherein the magnetic structure includes magnetic particles embedded in a polymer matrix.

3. The IC package support of claim 1, wherein the conductive line has a thickness between 20 microns and 30 microns.

4. The IC package support of claim 1, wherein the magnetic structure tapers by a distance between 5 microns and 15 microns.

5. The IC package support of claim 1, wherein the magnetic structure is a first magnetic structure, and the IC package support further includes:
   a second magnetic structure at a bottom surface of the conductive line, wherein the second magnetic structure has rounded shoulder portions.

6. The IC package support of claim 1, wherein the IC package support is a package substrate or an interposer.

7. The IC package support of claim 1, wherein the conductive line and magnetic structure are part of an air core inductor (ACI).

8. An electronic assembly, comprising:
- an integrated circuit (IC) package support, including a magnetic structure on a top surface and on side surfaces of a conductive line, wherein the magnetic structure has a rounded portion at a top surface of the magnetic structure.

9. The electronic assembly of claim 8, wherein the IC package support further includes:
- a first layer of dielectric material, wherein the magnetic structure is at least partially embedded in the first layer of dielectric material;
- a conductive pad at least partially embedded in the first layer of dielectric material;
- a second layer of dielectric material in contact with the top surface of the magnetic structure; and
- a conductive via in conductive contact with the conductive pad, wherein the conductive via extends through the first layer of dielectric material.

10. The electronic assembly of claim 9, wherein the conductive via also extends through the second layer of dielectric material.

11. The electronic assembly of claim 9, wherein the conductive via does not extend through the second layer of dielectric material.

12. The electronic assembly of claim 11, wherein the conductive via is a first conductive via, the IC package support further includes a second conductive via, the first conductive via is between the second conductive via and the conductive pad, and the second conductive via extends through the second layer of dielectric material.

13. The electronic assembly of claim 9, wherein the first layer of dielectric material has a thickness between 35 microns and 75 microns.

14. The electronic assembly of claim 8, wherein the IC package support further includes conductive contacts and the electronic assembly further includes one or more dies coupled to the conductive contacts.

15. The electronic assembly of claim 8, wherein the IC package support is included in an IC package, the electronic assembly further includes a circuit board, and the IC package is coupled to the circuit board.

16. An integrated circuit (IC) package, comprising:
- a package substrate including an air core inductor, wherein the air core inductor includes a conductive line and a magnetic structure on a top surface and on side surfaces of a conductive line, wherein the magnetic structure has a rounded portion at a top surface of the magnetic structure; and
- one or more dies coupled to the package substrate.

17. The IC package of claim 16, wherein the air core inductor is proximate to second-level interconnects of the package substrate.

18. The IC package of claim 16, wherein the air core inductor is in an interior layer of the package substrate.

* * * * *